(12) United States Patent
Saito et al.

(10) Patent No.: US 6,793,832 B1
(45) Date of Patent: Sep. 21, 2004

(54) PLASMA ETCHING METHOD

(75) Inventors: Takeshi Saito, Yamanashi (JP); Kazuya Nagaseki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/807,896
(22) PCT Filed: Oct. 22, 1999
(86) PCT No.: PCT/JP99/05821
§ 371 (c)(1),
(2), (4) Date: Apr. 19, 2001
(87) PCT Pub. No.: WO00/24046
PCT Pub. Date: Apr. 27, 2000

(30) Foreign Application Priority Data

Oct. 22, 1998 (JP) .......................................... 10-319942

(51) Int. Cl.$^7$ ........................................... H01L 21/306
(52) U.S. Cl. ............................ 216/37; 216/58; 216/68; 438/706; 438/723
(58) Field of Search .............................. 216/37, 58, 68; 438/706, 723

(56) References Cited

U.S. PATENT DOCUMENTS 4,985,114 A * 1/1991 Okudaira et al. ............. 216/37
5,573,597 A * 11/1996 Lantsman ............. 118/723 MP
5,888,414 A    3/1999 Collins et al. ................. 216/68

FOREIGN PATENT DOCUMENTS

JP          6-112166       4/1994

* cited by examiner

Primary Examiner—Nadine G. Norton
Assistant Examiner—Shamim Ahmed
(74) Attorney, Agent, or Firm—Finnegan, Henderson, Farabow, Garrett & Dunner, LLP

(57) ABSTRACT

A wafer W is placed on a lower electrode 106 provided inside a processing chamber 102 of an etching apparatus 100 and a gas containing C4F8 is induced into the processing chamber 102. A controller 112 implements control to apply 27 MHz power to an upper electrode 114 from a plasma generating power supply 120 and to intermittently apply 800 KHz power to the lower electrode 106 from a biasing power supply 108. While the biasing power is on, an insulating film 202 constituted of SiO2 at the wafer W is etched, whereas a polymer (protective film) 208 is formed at a photoresist film 206 while the biasing power is off. Adopting the above method, contact holes achieving a specific shape can be formed by improving the selectivity of the insulating film relative to the photoresist film.

7 Claims, 10 Drawing Sheets

PLASMA ETCHING METHOD

EXPLANATION OF THE REFERENCE NUMERALS

100 etching device
102 processing chamber
104 processing container
106 lower electrode
108 matcher
110 biasing power supply
121 controller
114 upper electrode
114a gas outlet hole
116 insulating member
118 matcher
120 plasma generating power supply
122 gas supply pipe
124 evacuating pipe
200 substrate
202 insulating film
206 photoresist film
208 polymer (protective film)
210 contact hole
W wafer

TECHNICAL FIELD

The present invention relates to a plasma etching method.

BACKGROUND ART

There is a plasma etching device proposed in the prior art, having an upper electrode and a lower electrode provided facing opposite each other inside an air-tight processing chamber. In this device, after placing a workpiece such as a semiconductor wafer (hereafter referred to as a "wafer") on the lower electrode, the processing gas is introduced into the processing chamber and also, vacuum drawing is implemented inside the processing chamber to maintain the atmosphere within at a specific pressure. Next, plasma generating power is applied to the upper electrode and biasing power sustaining a specific power level is applied to the lower electrode. As a result, the processing gas inside the processing chamber becomes dissociated to generate plasma and radicals, and an insulating film such as an $SiO_2$ (silicon oxide) film formed on the wafer becomes etched through ion-assist etching by the radicals and the ions in the plasma drawn into the wafer by the biasing power, thereby forming contact holes at the insulating film.

However, when forming contact holes in conformance to the 0.15 μm design rule, a higher aspect ratio must be achieved and thus, the etching rate at the insulating film is lowered. In addition, the photoresist film formed at the surface of the insulating film is constantly sputtered with the ions. During this process, the corners formed between the upper surface of the photoresist film and the pattern formation surface tend to be sputtered to a great degree. Consequently, the pattern width of the photoresist film 206 increases as shown in FIG. 2(d), presenting a problem in that a desired contact hole 210 cannot be formed. Accordingly, it is essential to achieve a technology that increases the ratio of the etching rate (or the etching quantity) at the insulating film 202 relative to the etching rate (or the etching quantity) at the photoresist film 206 (hereafter referred to as the "selectivity").

An object of the present invention, which has been completed by addressing the problem of the prior art discussed above, is to provide a new and improved plasma etching method that improves the etching selectivity and enables an ultra-fine etching process to be implemented on a workpiece.

DISCLOSURE OF THE INVENTION

In order to achieve the object described above, in a first aspect of the present invention, a plasma etching method for implementing a specific etching process on a workpiece placed on an electrode provided within a processing chamber by introducing a processing gas into the processing chamber, generating plasma inside the processing chamber with a plasma source and applying biasing power to the electrode, which is characterized in that an etching step in which the workpiece is etched over a specific length of etching time by applying the biasing power to the electrode and a film formation step in which a protective film is formed as an etching mask at a surface of the workpiece over a specific length of film formation time while the biasing power is cut off are sequentially repeated, with the lengths of the individual etching times and the individual film formation times adjusted as the etching process progresses, is provided.

In a second aspect of the present invention, a plasma etching method for implementing a specific etching process on a workpiece placed on an electrode provided within a processing chamber by introducing a processing gas into the processing chamber, generating plasma inside the processing chamber with a plasma source and applying biasing power to the electrode, which is characterized in that an etching step in which a workpiece is etched over a specific length of etching time by applying the biasing power to the electrode and a film formation step in which a protective film is formed as an etching mask at a surface of the workpiece over a specific length of film formation time while the biasing power is cut off are sequentially repeated, with the process starting with the film formation step and ending with the etching step is provided.

Adopting such an etching method, in which the etching process is implemented by repetitively performing the etching step and the film formation step, makes it possible to etch the workpiece while protecting the etching mask such as a photoresist film with the protective film. As a result, since the photoresist film is not readily etched and higher selectivity is achieved, the pattern at the photoresist film is prevented from spreading. In addition, since the protective film is formed at the mask pattern sidewalls during the film formation step, desired contact holes can be formed at the workpiece.

By adjusting the lengths of the individual etching times and the individual film formation times as the etching process progresses, a desired etching process can be implemented even if the states of the workpiece and the photoresist film change during the process.

Furthermore, the lengths of the individual film formation times may be extended as the etching process progresses. As the process progresses, the aspect ratio of the contact holes increases, which makes it difficult to form a protective film at the bottom surfaces of the contact holes. Thus, by extending the lengths of the individual film formation times, it is possible to ensure that the photoresist film is protected with a higher degree of reliability while implementing a specific etching process.

In addition, by setting the lengths of the individual film formation times at one second or longer, the protective film can be formed at the photoresist film with a high degree of reliability during the film formation steps.

By implementing an etching step at the end of the etching process, the protective film formed at the bottom surfaces of the contact holes and the photoresist film can be removed, thereby eliminating the need to implement a step for removing the protective film to allow the post-process to be completed promptly.

Furthermore, by implementing a film formation step at the beginning of the etching process, the photoresist film becomes protected by the protective film prior to the etching step, thereby enabling a desired process to be implemented on the workpiece.

Moreover, by constituting the etching target with a silicon oxide film and using a gas containing fluorocarbon gas as the processing gas, a protective film can be formed at the photoresist with a high degree of reliability and desired contact holes can be formed at the $CSiO_2$ film.

THE BEST MODE FOR CARRYING OUT THE INVENTION

The following is an explanation of an embodiment of the plasma etching method according to the present invention, given in reference to the attached drawings.

(1) Overall Structure of Etching Device

Figure 1:
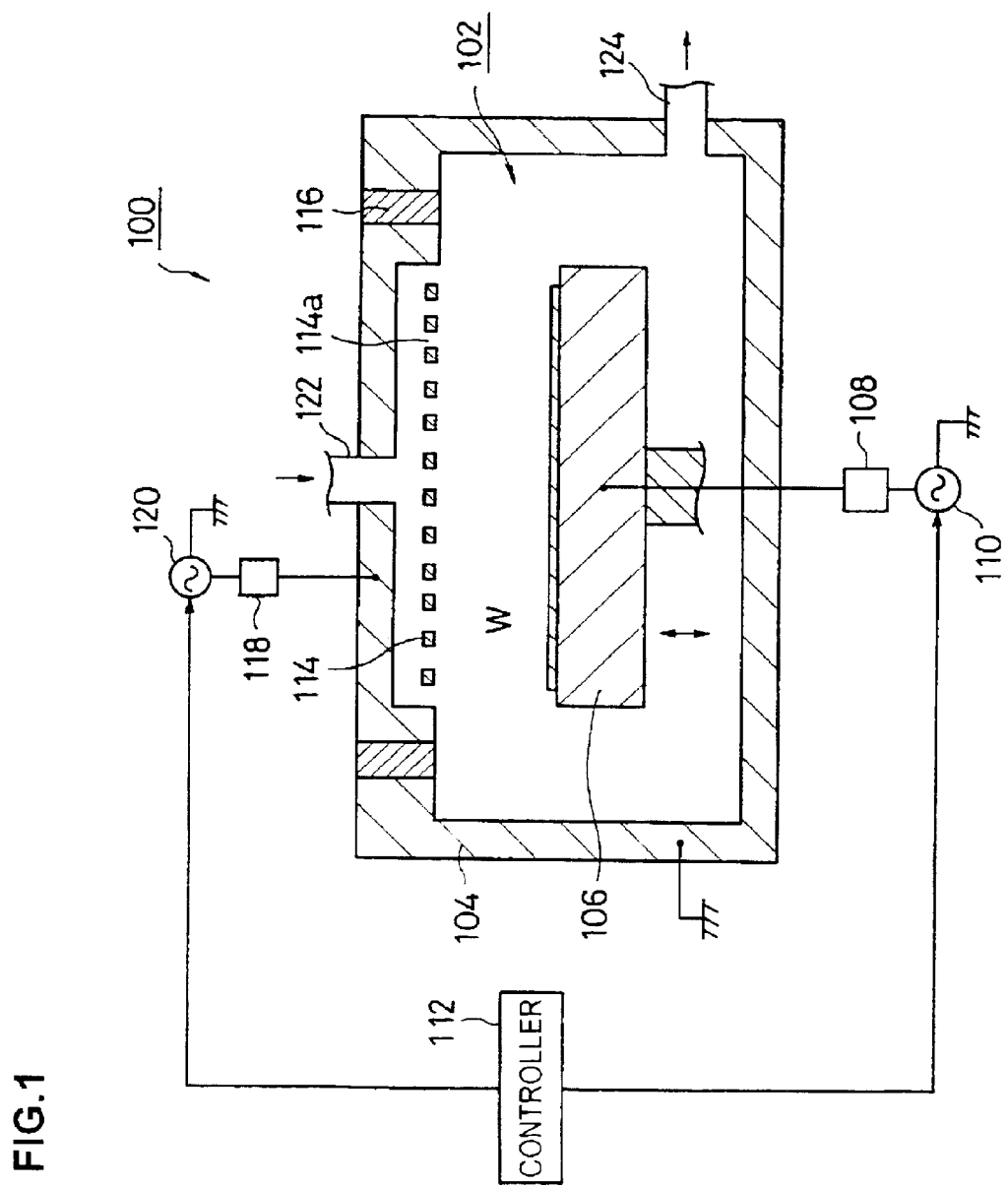
FIG. 1 is a schematic sectional view of an etching device in which the present invention may be adopted.

First, in reference to FIG. 1, the overall structure of a plane parallel type plasma etching device 100 in which the present invention may be adopted is explained.

A processing chamber 102 of the etching device 100 is formed inside an electrically conductive processing container 104 which is grounded for safety. Inside the processing chamber 102, a conductive lower electrode 106 is provided. The lower electrode 106 also functions as a stage on which a wafer W is placed. In addition a biasing power supply 110 that outputs biasing power in the embodiment is connected to the lower electrode 106 via a matcher 108. A controller 112 that controls the supply of biasing power is connected to the biasing power supply 110. It is to be noted that the structure adopted to implement the biasing power control is to be detailed later.

In addition, a conductive upper electrode 114 is provided at a position facing opposite the mounting surface of the lower electrode 106. Between the upper electrode 114 and the processing container 104, an insulating member 116 is provided. A plasma generating power supply 120 that outputs plasma generating power, the frequency of which is high relative to the frequency of the biasing power, is connected to the upper electrode 114 via a matcher 118. The controller 112 is also connected to the plasma generating source 120, to control the supply of plasma generating power.

Numerous gas outlet holes 114a are formed at the upper electrode 114. A processing gas supplied from a processing gas supply source (not shown) is evenly supplied into the processing container 104 via a gas supply pipe 122 and the gas supply holes 114a. Furthermore, an evacuating pipe 124 is connected at a lower position inside the processing container 104, with a vacuum pump (not shown) connected to the evacuating pipe 124.

(2) Etching Process Steps

Next, the etching process steps in performed the embodiment are explained in detail in reference to FIGS. 1~9.

Figure 2A:
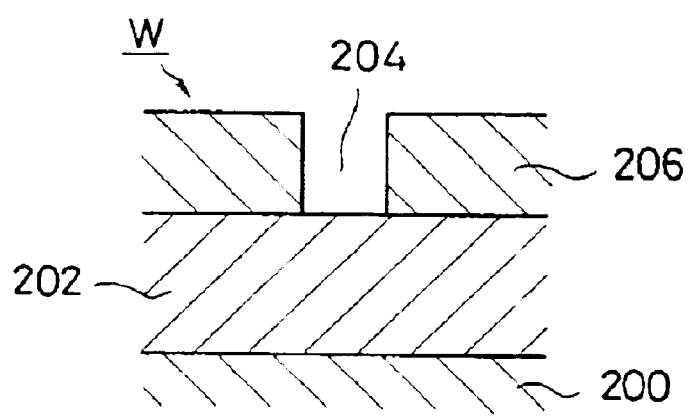
FIGS. 2(a)–2(d) presents schematic sectional views of a wafer W, illustrating the etching method adopted in the etching device shown in FIG. 1 and an etching method in the prior art.

First, the wafer W is placed on the lower electrode 106 in FIG. 1. At the wafer W, an insulating film 202 constituted of, for instance, $SiO_2$ is formed on a substrate 200 constituting the wafer W and a photoresist film 206 having a specific pattern 204 formed therein and constituting an etching mask is laminated over the insulating film 202 as illustrated in FIG. 2(a). In addition, the processing gas constituted of a mixed gas containing, for instance, $C_4F_8$, CO, Ar and $O_2$ is introduced into the processing chamber 102 in FIG. 1 from the gas supply source via the gas supply pipe 122 and the gas outlet holes 114a. At this time, the flow rates of $C_4F_8$, CO, Ar and $O_2$ are set to achieve a flow rate ratio of 1:4:15:1. Vacuum drawing is implemented inside the processing chamber 102 via the evacuating pipe 124 to sustain the pressure of the atmosphere at, for instance, 35 mTorr.

Next, the controller 112 implements control to apply a high-frequency power with a frequency of 27 MHz and a power level of 4 W~5 W per $cm^2$ of the upper electrode (114) to the upper electrode 114 from the plasma generating power supply 120 via the matcher 118 and, as described later, to intermittently apply a high-frequency power with a relatively low frequency of 800 KHz compared to the frequency of the plasma generating power and a power level of 5 W per $cm^2$ of the wafer W to the lower electrode 106 from the biasing power supply 110 via the matcher 108.

Now, in reference to FIGS. 2~9, the structure adopted to implement the biasing power control is explained.

Figure 3:
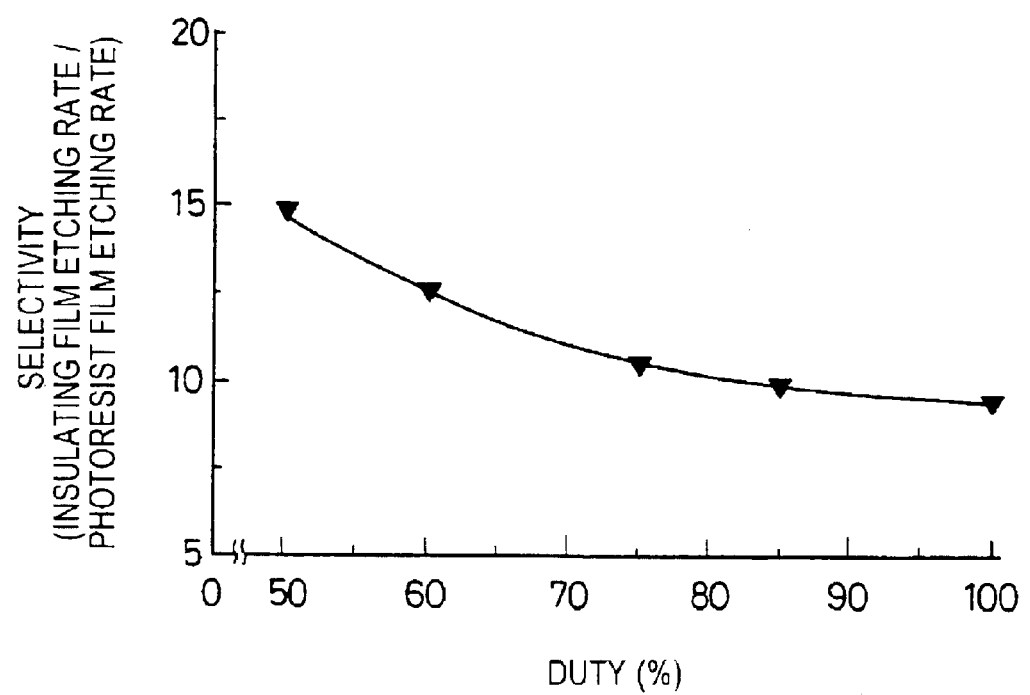
FIG. 3 schematically illustrates the relationship between the selectivity and the duty to facilitate an explanation of the etching method adopted in the etching device shown in FIG. 1.
Figure 4:
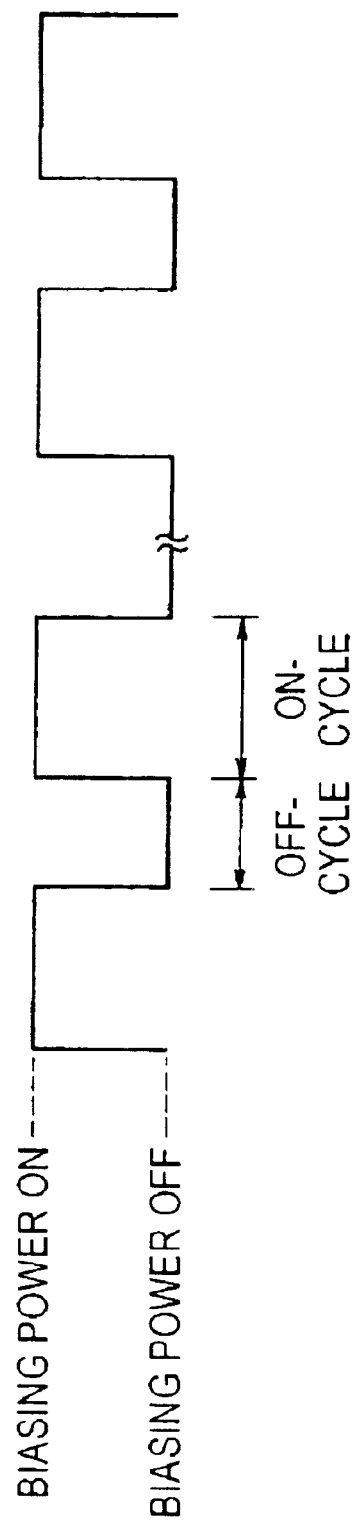
FIG. 4 schematically illustrates the on/off cycle of the biasing power to facilitate the explanation of the etching method adopted in the etching device shown in FIG. 1.

As illustrated in FIG. 4, on-cycle processing (hereafter referred to as an "etching step") during which the biasing power is applied is first implemented. Next, off-cycle processing (hereafter referred to as a "film formation step") during which the biasing power is not applied is implemented. FIG. 3 illustrates the relationship between the selectivity and the duty at a given position on the wafer W at a point in time at which nine etching steps and eight film formation steps have been alternately performed. The selectivity represents a ratio; quantity of insulating film 202 that has been etched/quantity of photoresist film 206 that has been etched. The duty represents; on-cycle period/(on-cycle period+off-cycle period). In addition, the on-cycle period is set at 30 seconds whereas the off cycle period is set at a length of time that achieves the duty. It is to be noted that the duty of 100% is achieved when the biasing power is continuously applied. It is not always necessary to cut off the biasing power during the film formation step and the biasing power may be reduced to a degree at which a film can be formed, instead.

FIG. 3 shows that by lowering the duty, the selectivity can be improved. One conceivable reason for this is as follows. While the biasing power is applied to the lower electrode 106 (during an etching step), the insulating film 202 becomes etched through ion-assist etching by CFx ions and CFx radicals generated through the dissociation of $C_4F_8$, Ar ions and the like. The photoresist film 206, on the other hand, is sputtered (etched) by the ions at an etching rate lower than that at the insulating film 202.

Figure 2B:
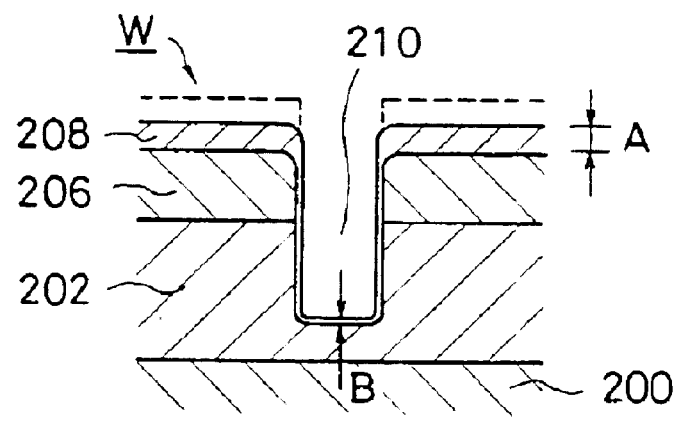

When the biasing power is not applied (during a film formation step), ions are not drawn to the wafer W. As a result, as shown in FIG. 2(b), the CFx radicals becoming adhered to a surface of the photoresist film 206 form a polymer film 208. Likewise, a polymer film 208 is formed at a surface of the insulating film 202 as well. However, since the surface of the insulating film 202 is set deeper by, at least, a degree corresponding to the thickness of the photoresist film 206 and the radical particles undergo thermal motion (random motion), the thickness (B) of the polymer formed at the surface of the insulating film 202 is smaller than the thickness (A) of the polymer film 208 formed at the surface of the photoresist film 206. This point will be detailed later in reference to FIG. 8.

Furthermore, the polymer film 208 can be assumed to adhere more readily to the photoresist film 206 which is constituted of all, for instance, CxFyOz and is closer to the polymer film 208 in molecular composition than the insulating film 202 constituted of SiO2. This point will be detailed later in reference to FIG. 9.

During an etching step implemented after the film formation step, the polymer film 208 functions as a protective film for the photoresist film 206. Namely, since the polymer film 208 is first etched and then the photoresist film 206 is etched, the quantity of the photoresist film 206 that is etched is reduced. Since the thickness of the polymer film 208 on the insulating film 202 is small, the progress of the etching process on the insulating film 202 is not greatly hindered.

During an etching step, the insulating film 202 is etched at an etching rate of approximately 8000 angstroms/min, the photoresist film 206 is etched at an etching rate of approximately 800 angstroms/min and the polymer film 208 constituting the protective film is etched at an etching rate of approximately 2300 angstroms/min. During the film formation step, the polymer film 208 is formed at the surface of the photoresist film 206 at approximately 1800 angstroms/min. This substantiates the selectivity of 10 achieved by constantly applying biasing power and a selectivity of 15 achieved when the biasing power is applied at a duty of 50% as shown in FIG. 3.

Figure 5:
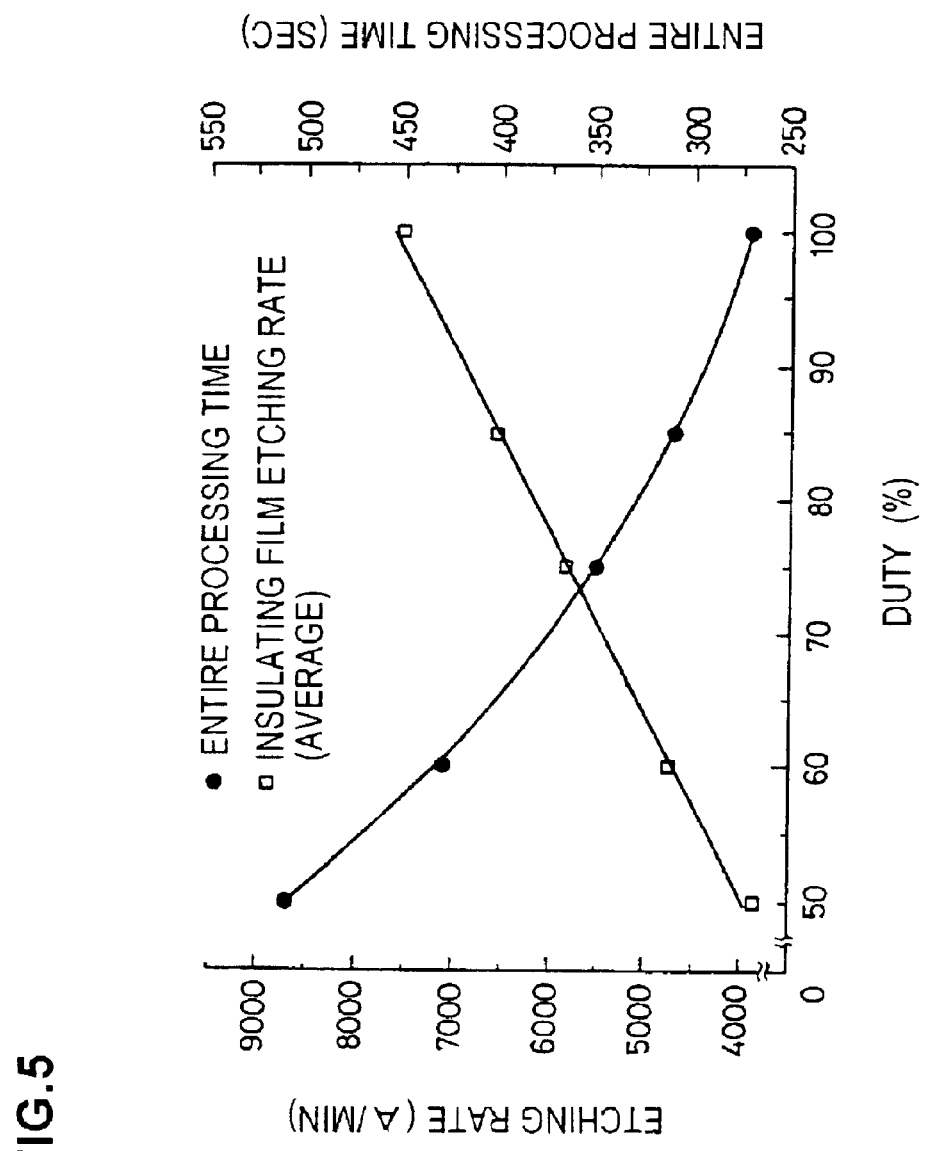
FIG. 5 schematically illustrates the relationship between the length of the entire process time and the etching rate at the insulating film observed as the duty is varied to facilitate the explanation of the etching method adopted in the etching device shown in FIG. 1.

In addition, FIG. 5 illustrates the relationship between the entire length of the process time and the average etching rate (etching quantity at the insulating film 202/entire length of time for the process including film formation steps) at the insulating film 202 observed by varying the duty under conditions identical to those in FIG. 3. FIG. 5 indicates that when the duty is lowered, the average etching rate is reduced and the entire length of time for the process increases.

Figure 6:
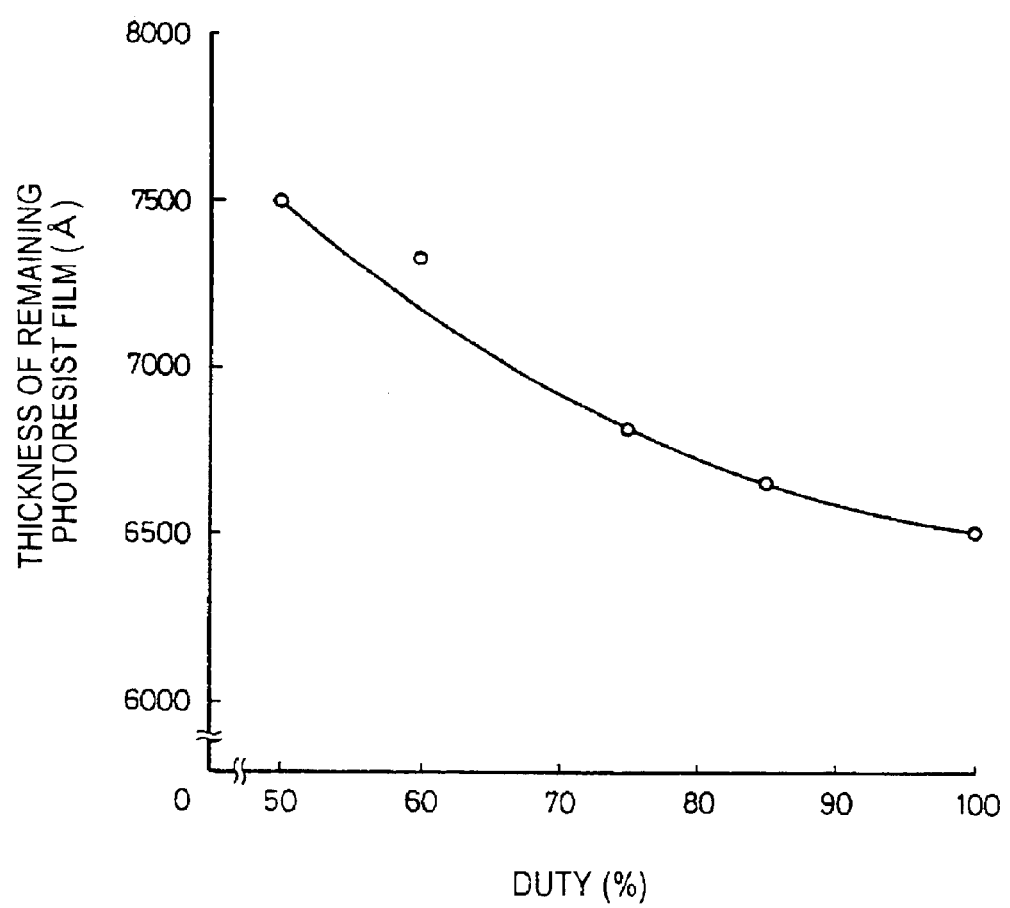
FIG. 6 schematically illustrates the relationship between the thickness of the remaining photoresist film and the duty to facilitate the explanation of the etching method adopted in the etching device shown in FIG. 1.

FIG. 6 shows the thickness of the photoresist film 206 remaining unetched when the entire process is completed by changing the duty under conditions identical to those in FIG. 3. FIG. 6 indicates that by lowering the duty, the quantity of the remaining photoresist film 206 is increased to enable formation of a contact hole 210 (see FIG. 2(c)) having the desired shape as a result.

Figure 7A:
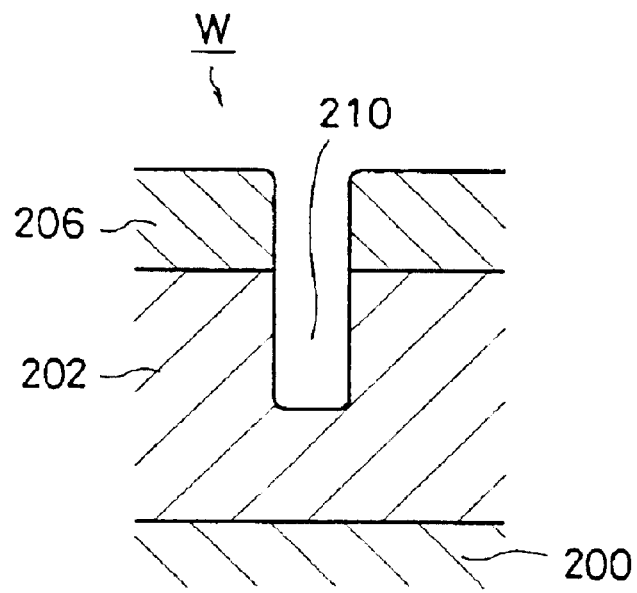
FIGS. 7(a)–7(b) presents schematic sectional views of the wafer W, illustrating the etching method adopted in the etching device shown in FIG. 1.
Figure 7B:
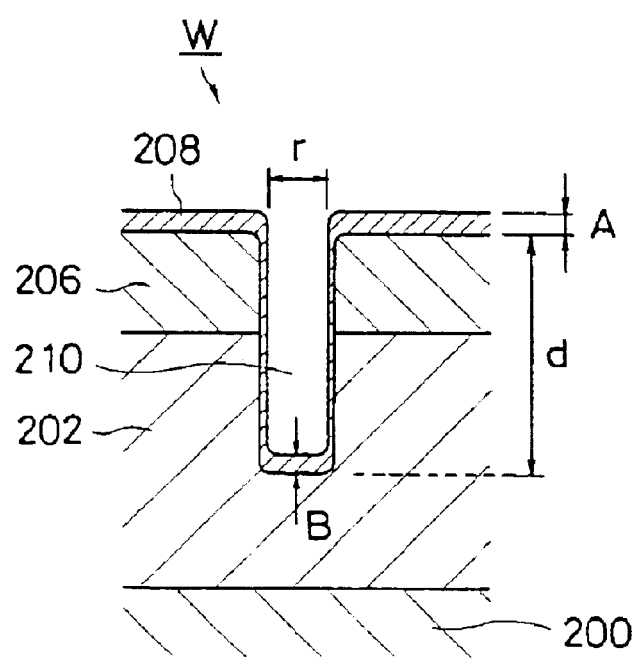

FIG. 7(b) illustrates the states of the bottom surface of the contact hole 210 and the polymer 218 formed at the upper surface of the photoresist film 206 after a film formation step is implemented over a specific length of time on the wafer W shown in FIG. 7(a). In addition, FIG. 8 indicates the ratio of the thickness B of the polymer film 208 formed at the bottom surface of the contact hole 210 relative to the thickness A of the polymer film 208 formed at the upper surface of the photoresist film 206, achieved by varying the aspect ratio of the contact hole 210 shown in FIG. 7(b). It is to be noted that in this specification, the aspect ratio refers to the ratio (d/r) of the distance d between the upper surface of the photoresist film 206 and the bottom surface of the insulating film 202 and the diameter r of the contact hole 210.

Figure 8:
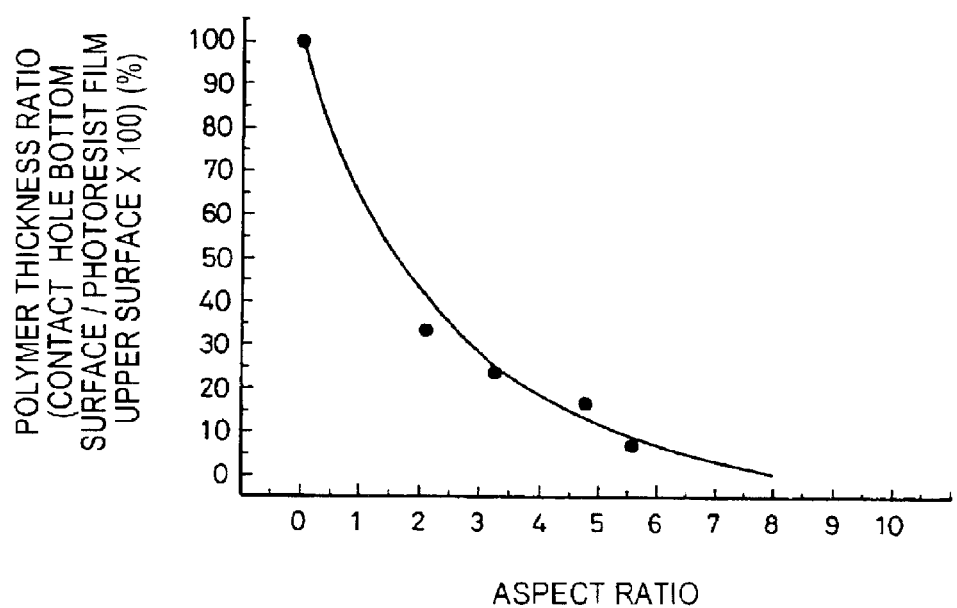
FIG. 8 schematically illustrates the relationship between the aspect ratio and the thickness of the polymer to facilitate the explanation of the etching method adopted in the etching device shown in FIG. 1.

FIG. 8 indicates that as the aspect ratio increases, i.e., as the etching process progresses to deepen the contact hole 210, the thickness B of the polymer film 208 formed at the bottom surface of the 210 becomes smaller relative to the thickness A of the polymer film 208 formed at the upper surface of the photoresist film 206.

Figure 9:
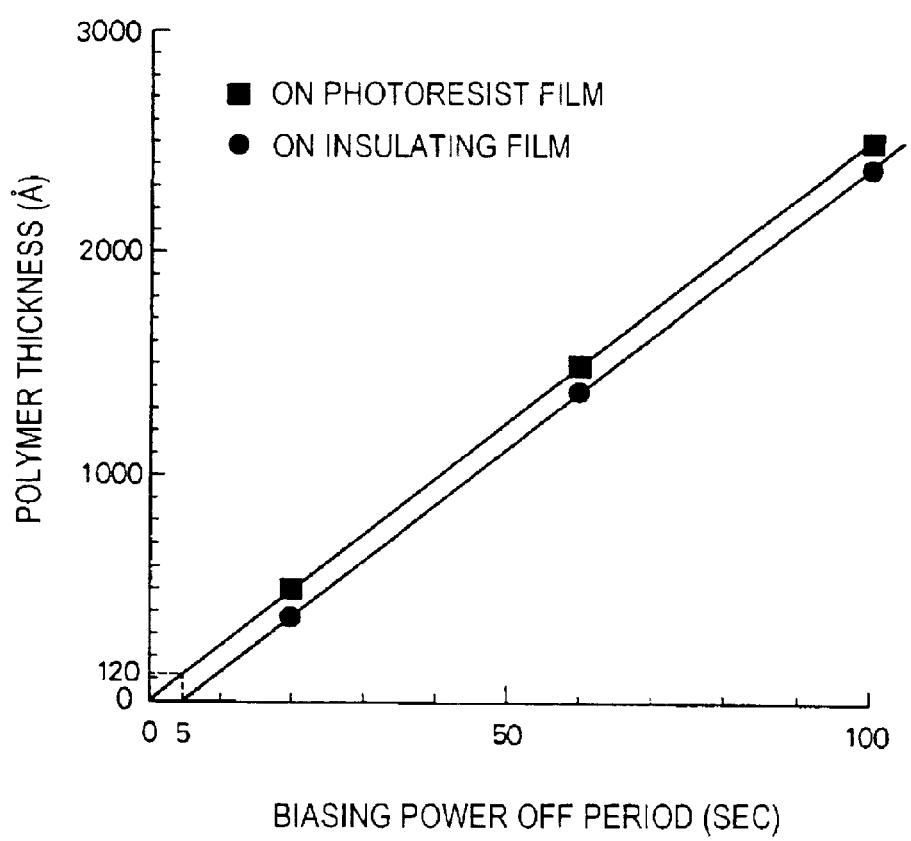
FIG. 9 schematically illustrates the relationship between the biasing power off time and the thickness of the polymer to facilitate the explanation of the etching method adopted in the etching device shown in FIG. 1.

FIG. 9 presents a comparison of the speed at which the film constituted of the polymer film 208 is formed when the photoresist film 206 is formed at the surface of the wafer W and the speed at which the film constituted of the polymer film 208 is formed when the insulating film ($SiO_2$ film) 202 is formed at the surface of the wafer W, during a film formation step implemented under process conditions identical to those in FIG. 3. FIG. 9 indicates that no polymer film 208 is formed on the insulating film 202 until the polymer film 208 is formed on the photoresist film 206 at approximately 120 angstroms. During such a short period of time (5 seconds), the polymer film 208 or the like is not formed at the insulating film 202 even if the application of the biasing power is stopped.

The following conclusion may be drawn from the test data discussed above. FIG. 4 shows a process starting with an etching step and ending with an etching step with each etching step extending over 30 seconds, as explained earlier. If an etching step is implemented at the beginning and at the end of the process in this manner, the entire length of time for the process can be reduced by increasing the length of time corresponding to a single cycle constituted of an etching step and a film formation step even when the duty remains unchanged.

In addition, an etching step is implemented at the end of the process in the embodiment, since residues such as the polymer film 208 would remain adhering to the surface of the photoresist film 206 and the bottom surface of the contact hole 210 if a film formation step was implemented at the end of the process to necessitate a step removing the polymer and the like to be implemented resulting in a reduction in the throughput. In other words, during an etching step at the end of the process, etching is performed until the polymer film 208 is removed and the formation of the contact hole 210 is completed.

Moreover, as shown in FIG. 9, if the film formation step is implemented for only five seconds, no polymer film 208 is formed on the insulating film 202 while a polymer film 208 is formed on the photoresist film 206. While the length of time may be other than five seconds depending upon the process conditions such as the type of processing gas being used, the polymer film 208 is formed on the photoresist film 206 as long as the film formation step is implemented over at least one second to achieve an advantage similar to that described above. It is to be noted that generally, the length of time for the etching step should be set greater than the length of time the film formation step to reduce the process time. In addition, since the on/off cycle of the biasing power is one second or longer in the embodiment, easy on/off control on the power supply is achieved in the software without having to utilize a special pulse source.

When the diameter of the contact hole 210 is small, a specific aspect ratio is assured at the beginning of the etching process. Thus, as shown in FIG. 8, since the polymer film 208 is formed at a very small thickness on the insulating film 202 even if a film formation step is implemented at the beginning of the process, the etching speed is not greatly reduced and, at the same time, the polymer film 208 is formed at the photoresist film 206 in advance to achieve an improvement in the selectivity.

Moreover, as the etching process progresses, the aspect ratio of the contact hole 210 increases and the speed at which the film constituted of the polymer film 208 is formed at the bottom surface of the contact hole 210 during the film formation step becomes lowered. As a result, the degree to which the contact hole 210 is prevented from becoming etched by implementing the film formation step is reduced compared to that at the beginning of the etching process. Consequently, by lowering the duty or reducing the length of time for the etching step, increasing the length of time for the film formation step as the etching process progresses, a specific etching process can be implemented on the insulating film 202 while forming the polymer film 208 at the photoresist film 206 with a high degree of reliability.

In addition, by adopting the embodiment, in which the photoresist film 206 is etched after the polymer film 208 formed on the photoresist film 206 through the film formation step, the selectivity can be raised. It is to be noted, however, that if the selectivity is raised to an excessive degree, the length of the process time increases.

Figure 2C:
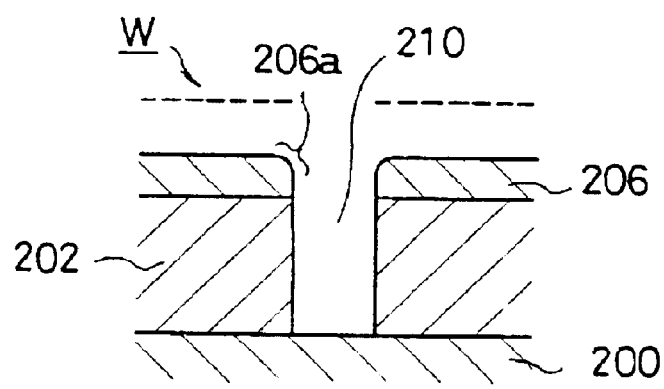
Figure 2D:
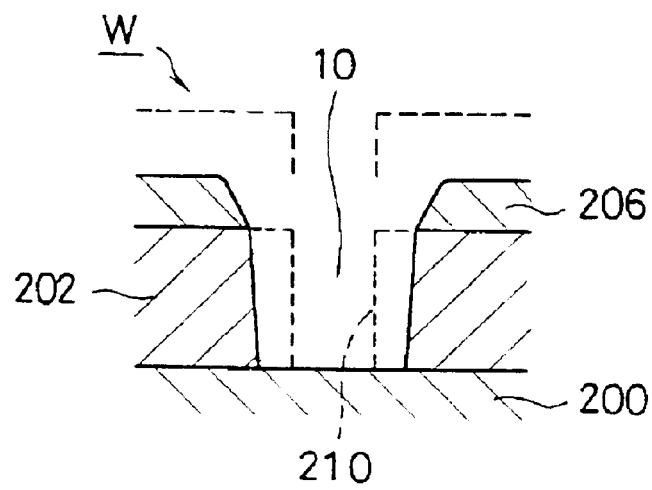

Only a small quantity of the photoresist film 206 needs to remain unetched, which is enough to ensure that the contact hole 10 with a poor shape shown in FIG. 2(d) is not formed when the entire process is completed. Accordingly, the duty and the lengths of time for a single etching step and a single film formation step are set so as to minimize the length of time for the process by taking into consideration factors such as the thicknesses of the insulating film 202 and the photoresist film 206, the etching rates at the insulating film 202 and at the photoresist film 206, the film formation rate for the polymer film 208, the diameter of the contact holes being formed, the degree to which the etching process progresses, the type of processing gas being used, the level of the biasing power and the like.

In the embodiment implemented as described above in which the etching process is performed while forming the polymer film 208 at the upper surface and the shoulders of the photoresist film 206, the photoresist film 206 is not etched to an excessive degree during the process and, in particular, shoulders 206a in FIG. 2(c) are protected from damage. As a result, a contact hole 210 achieving a high aspect ratio can be formed with a high degree of reliability based upon the pattern 204. In addition, since the polymer film 208 becomes adhered to the inner side surface of the contact hole 210 as shown in FIG. 2(b), the inner sidewall of the contact hole 210 that has already been formed is not readily etched, thereby effectively preventing the contact hole 210 from becoming bowed.

While the invention has been particularly shown and described with respect to the preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given in reference to the embodiment on an example in which biasing power at 800 KHz is applied to the lower electrode, the present invention may be implemented by applying power with a frequency other than 800 KHz as the biasing power.

Furthermore, while an explanation is given in reference to the embodiment on an example in which the insulating film is constituted of $SiO_2$, the present invention is not limited to this example and it may be adopted to etch an insulating film constituted of, for instance, BPSG (boron-phospho-silicate glass), TEOS (tetra-ethylorth-osilicate), SOG (spin-on glass), SiOF or a thermal oxide film ($SiO_2$) or to implement an etching process on a target other than an insulating film.

Moreover, while an explanation is given in reference to the embodiment on an example in which the present invention is adopted in conjunction with a plane parallel type plasma etching device, the present invention is not limited to this example and it may be adopted in a plasma etching device having a plasma source such as an inductively coupled etching device or a microwave etching device as long as biasing power can be applied to the workpiece.

According to the present invention in which a film formation step is implemented to form a protective film at, for instance, an exposed surface of a photoresist film during the etching process, the photoresist film is prevented from becoming etched readily by the protective film, to achieve an improvement in the selectivity. As a result, the etching pattern formed at the photoresist film can be maintained in a state which is essentially identical to the initial state until the process is completed, so that specific ultra-small contact holes can be formed based upon the pattern. Furthermore, since a protective film is also formed at the inner side walls of the contact holes to protect the inner side walls, bowing resulting from the inner side wall surfaces becoming etched is prevented, to enable formation of contact holes achieving a specific shape.

INDUSTRIAL APPLICABILITY

The present invention may be adopted in a plasma etching method. In particular, the present invention is ideal in application requiring a high aspect ratio such as ultra-fine processing to be implemented in conformance to the 0.15 $\mu$m design rules.

What is claimed is:

1. A plasma etching method for implementing a specific etching process on a workpiece placed on an electrode provided within a processing chamber by introducing a processing gas into said processing chamber, generating plasma inside said processing chamber with a plasma source and applying biasing power to said electrode, wherein;

performing an etching step in which the workpiece is etched over a specific length of etching time by applying the biasing power to said electrode and a film formation step in which a protective film is formed as an etching mask at a surface of the workpiece over a specific length of film formation time while the biasing power is decreased or cut off are sequentially repeated, with the film formation time being increased relative to the length of etching time as the etching process progresses.

2. A plasma etching method according to claim 1, wherein:

the lengths of the film formation times are extended relative to the extent to which the etching process has progressed.

3. A plasma etching method according to claim 1, wherein:

the lengths of the film formation times are set at 1 second or longer.

4. A plasma etching method according to claim 1, wherein:

said etching step is implemented as a final step of said etching process.

5. A plasma etching method according to claim 1, wherein:

said film formation step is implemented as a first step of said etching process.

6. A plasma etching method according to claim 1, wherein:

the etching target is a silicon oxide film; and said processing gas is constituted of a gas containing fluorocarbon gas.

7. A plasma etching method according to claim 1, wherein the length of etching time is decreased relative to the film formation time as the etching process progresses.

* * * * *

UNITED STATES PATENT AND TRADEMARK OFFICE
CERTIFICATE OF CORRECTION

PATENT NO.     : 6,793,832 B1
DATED          : September 21, 2004
INVENTOR(S)    : Takeshi Saito and Kazuya Nagaseki It is certified that error appears in the above-identified patent and that said Letters Patent is hereby corrected as shown below:

<u>Title page,</u>
Item [57], ABSTRACT,
Line 3, "C4F8" should read -- $C_4F_8$ --, and "induced" should read -- introduced --.
Line 9, "SiO2" should read -- $SiO_2$ --.

Signed and Sealed this

Fourth Day of January, 2005

JON W. DUDAS
*Director of the United States Patent and Trademark Office*